United States Patent
Toyama et al.

[11] Patent Number: 6,039,809
[45] Date of Patent: Mar. 21, 2000

[54] METHOD AND APPARATUS FOR FEEDING A GAS FOR EPITAXIAL GROWTH

[75] Inventors: Yoshiharu Toyama; Akikazu Kuroda; Tokuji Kiyama; Sumio Kida; Shunji Yoshida, all of Tokyo; Takashi Yamamoto; Tetsuya Atsumi, both of Mie, all of Japan

[73] Assignees: Mitsubishi Materials Silicon Corporation, Tokyo; Mitsubishi Materials Polycrystalline Silicon Corporation, Mie, both of Japan

[21] Appl. No.: 09/085,750

[22] Filed: May 28, 1998

[30] Foreign Application Priority Data

Jan. 27, 1998 [JP] Japan .................................. 10-014420

[51] Int. Cl.[7] .................................................. C23C 16/00
[52] U.S. Cl. .......................................... 118/715; 118/726
[58] Field of Search ...................................... 118/715, 726

[56] References Cited

U.S. PATENT DOCUMENTS

| | | | |
|---|---|---|---|
| 5,160,542 | 11/1992 | Mihira et al. .......................... | 118/715 |
| 5,451,258 | 9/1995 | Hillman et al. ......................... | 118/715 |
| 5,460,654 | 10/1995 | Kikkawa et al. ........................ | 118/726 |
| 5,470,390 | 11/1995 | Nishikawa et al. ..................... | 118/719 |
| 5,496,408 | 3/1996 | Motoda et al. .......................... | 118/715 |
| 5,690,743 | 11/1997 | Murakami et al. ..................... | 118/715 |
| 5,730,804 | 3/1998 | Gomi et al. .............................. | 118/726 |

*Primary Examiner*—Jan H. Silbaugh
*Assistant Examiner*—Dae Young Lee
*Attorney, Agent, or Firm*—McAulay Nissen Goldberg Kiel & Hand, LLP

[57] ABSTRACT

A liquid raw material is heated to its boiling point or higher at a vaporizer to mix the vaporized ingredient gas and a carrier gas at a mixer at predetermined concentrations. The flow of the mixed gas is adjusted while the mixed gas is heated to over its condensing point and the temperature thereof is kept. Subsequently, the mixed gas is fed to a reactor for epitaxial growth while the mixed gas is heated to over its condensing point and the temperature thereof is kept. When the temperature of a heating medium is kept constant at the vaporizer to vaporize the liquid raw material and the feeding amount of the liquid into the vaporizer is adjusted by the pressure of the gas inside the vaporizer, the liquid surface level can be controlled to be constant.

5 Claims, 4 Drawing Sheets

Prior Art

METHOD AND APPARATUS FOR FEEDING A GAS FOR EPITAXIAL GROWTH

BACKGROUND OF THE INVENTION

1. Field of the Invention

The present invention relates to a method and an apparatus for vaporizing a liquid raw material into an ingredient gas and feeding this ingredient gas as a reacting gas into a reactor for epitaxial growth.

2. Description of the Related Art

As a reacting gas fed into this type of reactor for epitaxial growth, there is mainly used a gas obtained by vaporizing a liquid raw material such as dichlorosilane ($SiH_2Cl_2$), trichlorosilane ($SiHCl_3$) or tetrachlorosilane ($SiCl_4$). These raw materials except dichlorosilane are liquids at room temperature and atmosphere pressure.

Hitherto, the reacting gas as an ingredient gas has been mixed with a carrier gas to feed the mixed gas into a reactor. As illustrating in, for example, FIG. 4, the method for feeding this mixed gas includes a method of blowing a carrier gas 3 into a liquid raw material 2 to bubble the liquid raw material 2, thereby producing a mixed gas 4 of an ingredient gas obtained by vaporizing the liquid raw material and the carrier gas 3, and feeding the mixed gas, as it is, into a reactor for epitaxial growth 6. Other methods include a method of further mixing the mixed gas with diluting hydrogen gas to obtain a mixed gas whose ingredient gas has a predetermined concentration, and feeding the mixed gas into a reactor, as not illustrated in any figures, and a method of further injecting a dopant such as phosphorus into the mixed gas and feeding the resultant gas into a reactor. The mixed gas is fed into the reactor in such a manner as above, so as to epitaxial-grow a silicon mono-crystal thin layer on a mono-crystal silicon substrate set in the reactor.

The above-mentioned methods of feeding the mixed gas by bubbling have the following problems.

1) In the case of using a gas cylinder having a volume for filling up a 25 kg liquid raw material and the total weight of about 50 kg, considering handling by a worker, and feeding the mixed gas into plural reactors with the single gas cylinder, the concentration of the ingredient gas included in the mixed gas is easily changed, so that the respective reaction speeds in the reactors are changed. Therefore, the mixed gas can be in general fed from the single gas cylinder to only one reactor.

2) The flowing amount of the ingredient gas depends on the vapor pressure of the liquid raw material which is changed dependently on the temperature of the liquid, the pressure in the gas cylinder, and the flowing amount of the carrier gas. As a result, controlling the concentration of the ingredient gas is complicated.

3) When the liquid raw material is consumed so that the remaining amount thereof in the gas cylinder is decreased, the period for bringing the gas produced by bubbling in contact with the liquid raw material is shortened and the temperature of the liquid raw material is lowered by latent heat of the liquid raw material evaporated in bubbling. Thus, the concentration of the produced ingredient gas is reduced. As a result, the reaction speed in the reactor is also reduced.

4) Because the step for producing the ingredient gas from the liquid raw material by bubbling is a sort of distillation step, a very small amount of heavy metals and high boiling point impurities included in the liquid raw material remain in the liquid. Thus, as evaporation of the liquid raw material advances, the concentration of the impurities therein relatively rises. As a result, the amount of the impurities in the ingredient gas obtained by bubbling increases as the amount of the liquid decreases.

5) Whenever the gas cylinder is exchanged, the mouth for connecting the gas cylinder to the reactor is opened to the atmosphere. Thus, at that time substances such as water in the atmosphere come into the gas feeding system to deteriorate the quality of epitaxially grown thin layer.

6) Whenever the gas cylinder is exchanged, it is necessary to make a trial for checking the reaction condition for epitaxial growth in the reactor.

SUMMARY OF THE INVENTION

An object of the present invention is to provide a method and an apparatus for easily setting a desired concentration and a desired pressure of the gas for epitaxial growth.

Another object of the present invention is to provide a method and an apparatus for feeding the gas for epitaxial growth having a constant concentration from a single gas feeding apparatus to plural reactors.

Still another object of the present invention is to provide a method and an apparatus for feeding the gas for epitaxial growth having a high purity continually without interruption by exchanging the gas cylinder.

In order to accomplish the above-described objects, a method for feeding a gas for epitaxial growth according to the present invention comprises the steps of:

heating a liquid raw material at its boiling point or higher to vaporize the liquid raw material at a vaporizer, adjusting the flowing amount of an ingredient gas obtained by the vaporization at the vaporizer while heating the ingredient gas to over its condensing point and keeping the temperature of the ingredient gas, and feeding the ingredient gas the flowing amount of which is adjusted into a reactor for epitaxial growth while heating the ingredient gas to over its condensing point and keeping the temperature of the ingredient gas.

Another method for feeding a gas for epitaxial growth according to the present invention also comprises the steps of:

heating a liquid raw material at its boiling point or higher to vaporize the liquid raw material at a vaporizer, mixing an ingredient gas obtained by the vaporization at the vaporizer with a carrier gas so that the ingredient gas will have a predetermined concentration, adjusting the flowing amount of the mixed gas of the ingredient gas and the carrier gas while heating the mixed gas to over its condensing point and keeping the temperature of the mixed gas, and feeding the mixed gas the flowing amount of which is adjusted into a reactor for epitaxial growth while heating the mixed gas to over its condensing point and keeping the temperature of the ingredient gas.

Furthermore, an apparatus for feeding a gas for epitaxial growth according to the present invention comprises:

a vaporizer for heating a liquid raw material to its boiling point or higher to vapor it, a first mass flow controller for controlling a vaporized ingredient gas at the vaporizer to have a predetermined mass flow, a second mass flow controller for controlling a carrier gas to have a predetermined mass flow, a mixer for mixing the ingredient gas and the carrier gas controlled into the respective predetermined mass flows, a first flow adjusting valve for adjusting the flowing amount of the mixed gas of the ingredient gas and the carrier gas, a tube for feeding the flow-adjusted mixed gas into a reactor for epitaxial growth, and a means for heating the ingredient gas and the mixed gas to over its condensing point and keeping the temperature of them, at the range from the ingredient gas feeding tube of the vaporizer to the flow-adjusted mixed gas feeding tube for the reactor.

DESCRIPTION OF PREFERRED EMBODIMENTS

Figure 1:
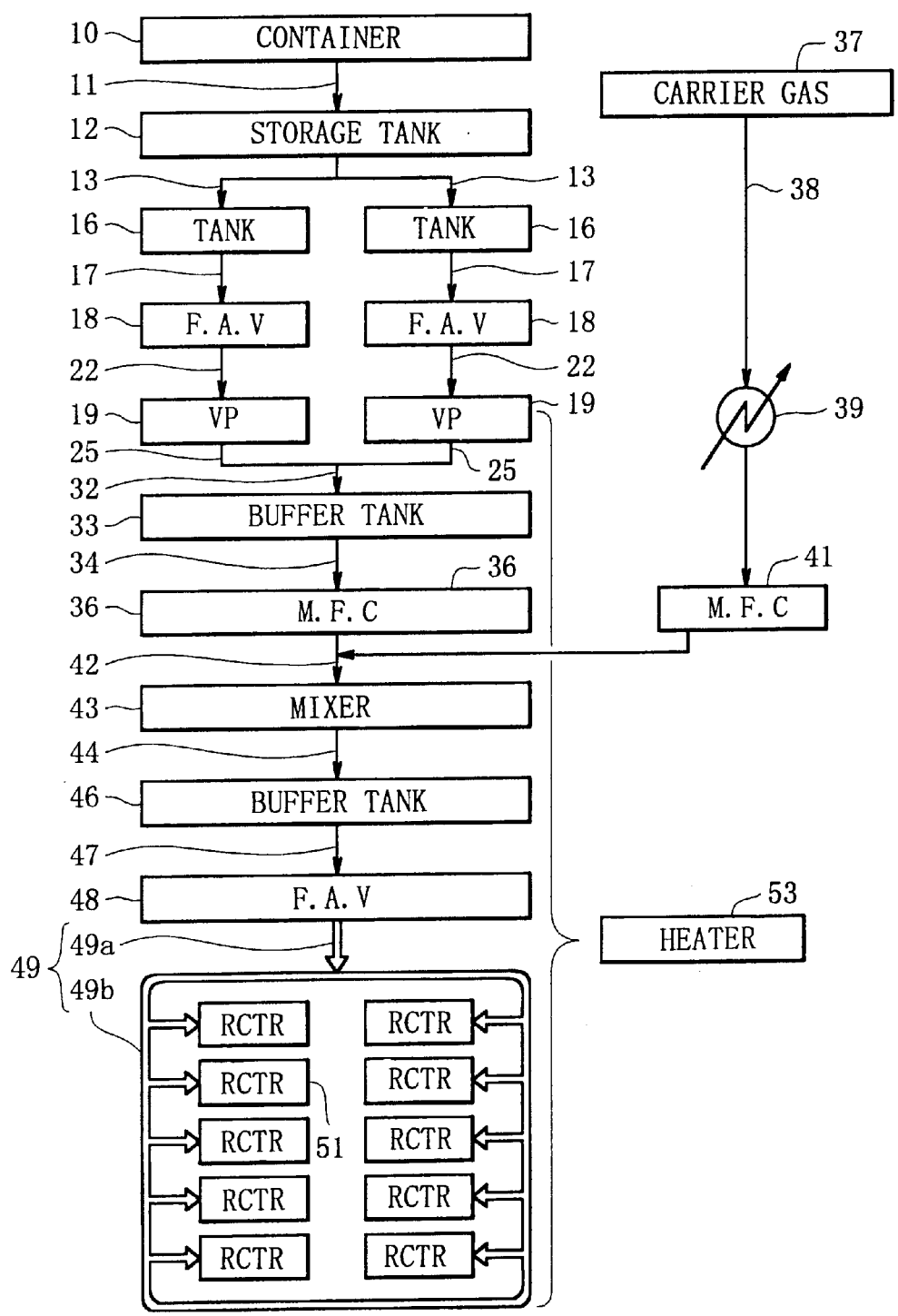
FIG. 1 shows an apparatus for feeding a gas for epitaxial gas according to the present invention.

The following will describe preferred embodiments according to the present invention.

In a preferred embodiment of the method for feeding a gas for epitaxial growth according to the invention, a medium for heating the liquid raw material at the vaporizer is water having a temperature of the boiling point of the liquid raw material or higher.

Heating the vaporizer by water having a temperature of the boiling point of the liquid raw material or higher causes the scattering in heating temperature to be smaller, so as to stabilize the vapor pressure of the ingredient gas specified by the heating temperature.

In a preferred embodiment of the feeding apparatus according to the invention, a plurality of the vaporizers are in parallel located, and the ingredient gas is forwarded from the single vaporizer selected from the plural vaporizers into the first mass flow controller.

By locating a plurality of the vaporizers and using them alternately, it is possible that heavy metals and high boiling point impurities remained in the liquid raw material by vaporization for a long time are prevented from being diffused into the ingredient gas and polluting the gas. Thus, the ingredient gas having a high purity can be forwarded into the mass flow controller continuously.

A preferred embodiment of the feeding apparatus according to the invention has a first buffer tank for storing the ingredient gas vaporized at the vaporizer, and therein the ingredient gas forwarded from the first buffer tank is controlled to have a predetermined mass flow with the first mass flow controller.

Fluctuation in the pressure of the ingredient gas can be absorbed by arranging the first buffer tank.

In a preferred embodiment of the feeding apparatus according to the invention, a medium for heating the liquid raw material at the vaporizer is water having a temperature of the boiling point of the liquid or higher, and this embodiment further has a pressure sensor for measuring the pressure of the ingredient gas inside the vaporizer or the first buffer tank, a second flow adjusting valve for adjusting the feeding amount of the liquid raw material into the vaporizer, and a controller for controlling the second flow adjusting valve on the basis of the output from the pressure sensor.

The vapor pressure of the gas obtained by vaporizing the liquid raw material in the vaporizer becomes a fixed value, under the condition that it is heated at a constant temperature. When the gas in the vaporizer is consumed, the pressure in the vaporizer drops. This drop causes the liquid raw material stored in the vaporizer to be vaporized until its vapor pressure reaches the above-mentioned fixed value, so that the amount of the liquid decreases. Namely, when the pressure sensor detects that the gas pressure in the vaporizer drops below the fixed value, the gas in the vaporizer is fed into the first buffer tank and vaporization of the liquid raw material is advanced, so that the controller, judging that the liquid amount is decreased, opens the second flow adjusting valve to feed the liquid raw material into the vaporizer.

When the consumption of the gas in the vaporizer is stopped, the gas pressure (vapor pressure) in the vaporizer rises over the fixed value, the gas is condensed so that the gas pressure will be the fixed value. Namely, when the pressure sensor detects that the gas pressure in the vaporizer rises over the fixed value, feeding the gas from the vaporizer is stopped and the gas is condensed in the vaporizer, so that the controller, judging that the liquid amount tends to increase, closes the second flow adjusting valve to stop feeding the liquid raw material into the vaporizer. This causes the liquid surface level in the vaporizer to be kept constant and causes the pressure of the ingredient gas forwarded from the vaporizer to be controlled into a constant value.

A preferred embodiment of the feeding apparatus according to the invention, further has a second buffer tank for storing the mixed gas mixed in the mixer, and therein the flowing amount of the mixed gas is adjusted with the first flow adjusting valve on the basis of the pressure of the mixed gas in the second buffer tank.

Fluctuation in the pressure of the mixed gas can be absorbed by arranging the second buffer tank. A constant flowing amount of the mixed gas can be fed into the reactor by adjusting the first flow adjusting valve on the basis of the pressure in the second buffer tank.

In a preferred embodiment of the feeding apparatus according to the invention, the tube comprises a main tube connected to the first flow adjusting valve and a loop tube for connecting the main tube to the plural reactors for epitaxial growth, and the mixed gas passing through the main tube can flow into the loop tube along two directions.

In the case of locating a plurality of the reactors, it is possible to reduce the pressure loss of the mixed gas in the downstream side reactors by making the mixed gas flow into the loop tube toward the two directions.

The following will describe the present invention more specifically, referring to the attached drawings.

Figure 2:
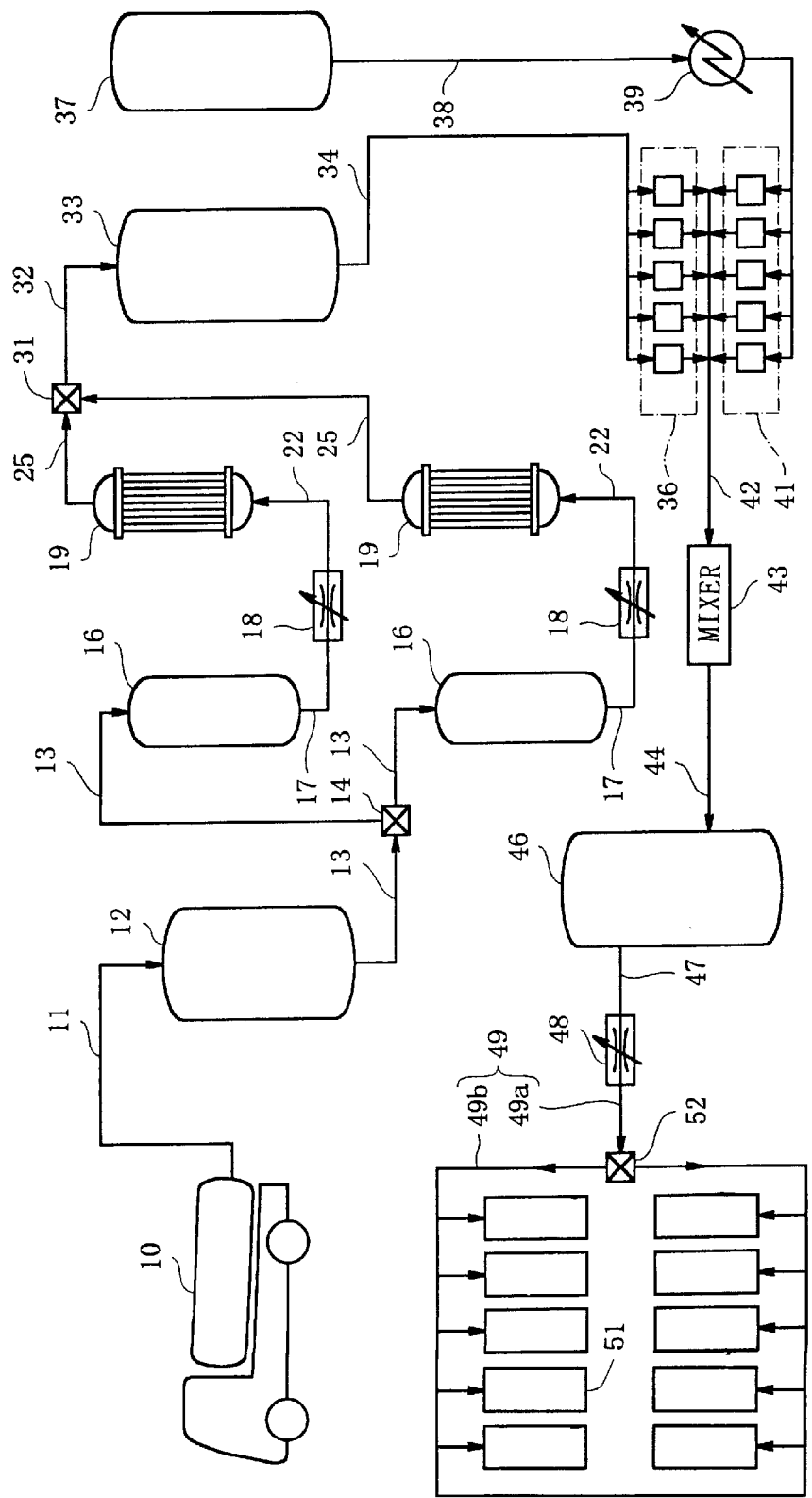
FIG. 2 shows the apparatus shown in FIG. 1 more specifically.

As illustrated in FIGS. 1 and 2, a container 10 is connected through a tube 11 to a storage tank 12. The liquid raw material used in the present invention includes, for example, dichlorosilane ($SiH_2Cl_2$), trichlorosilane ($SiHCl_3$) and tetrachlorosilane ($SiCl_4$).

Plural feeding tanks 16 are connected through a tube 13 and switching valve 14 to the storage tank 12. The figures illustrate two feeding tanks, but three or more tanks may be used. Vaporizers 19 are connected through respective tubes 17 and flow adjusting valves 18 to the feeding tanks 16. Thus, plural vaporizers 19 are in parallel provided to the single storage tank 12.

Figure 3:
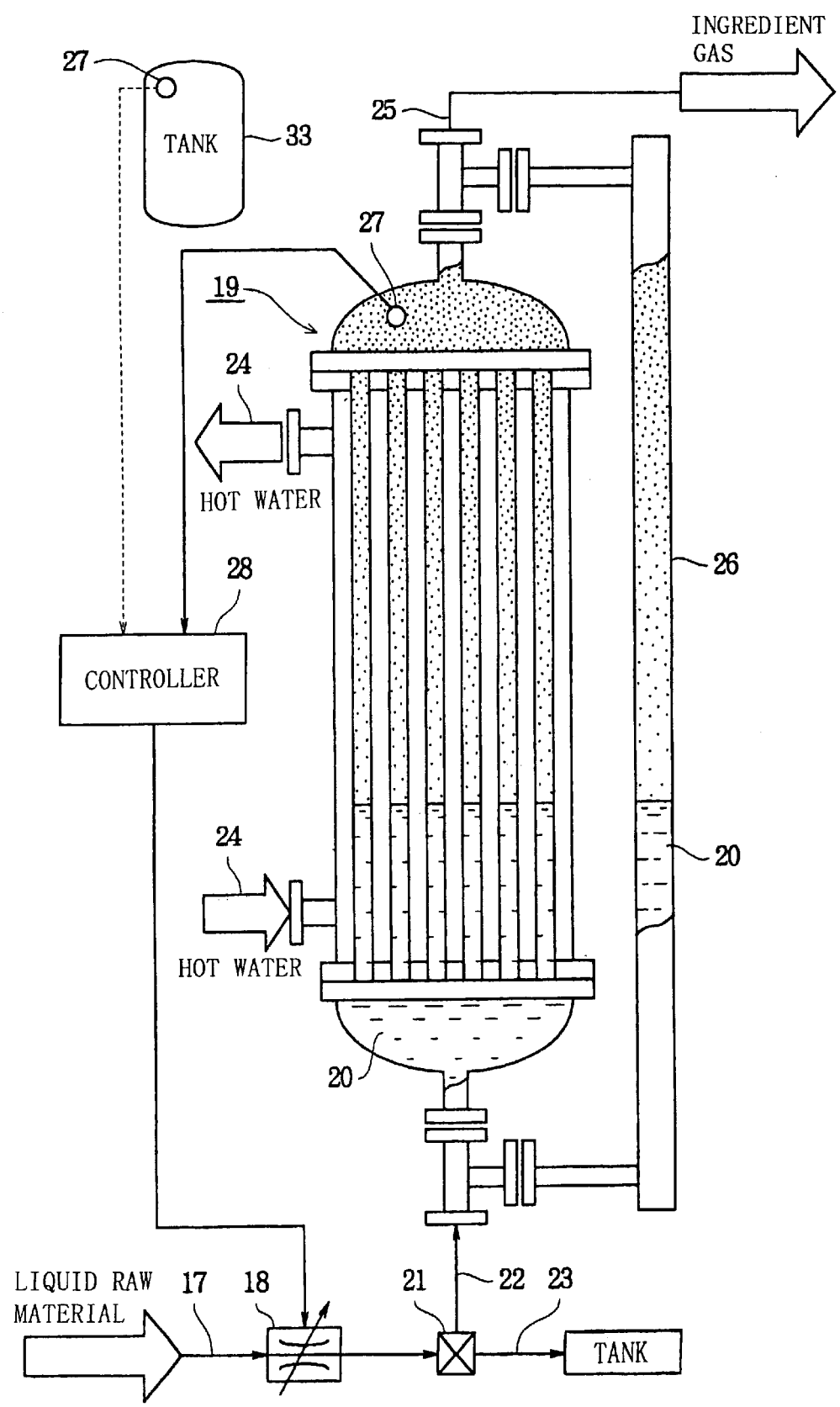
FIG. 3 shows a vaporizer in the apparatus.
Figure 4:
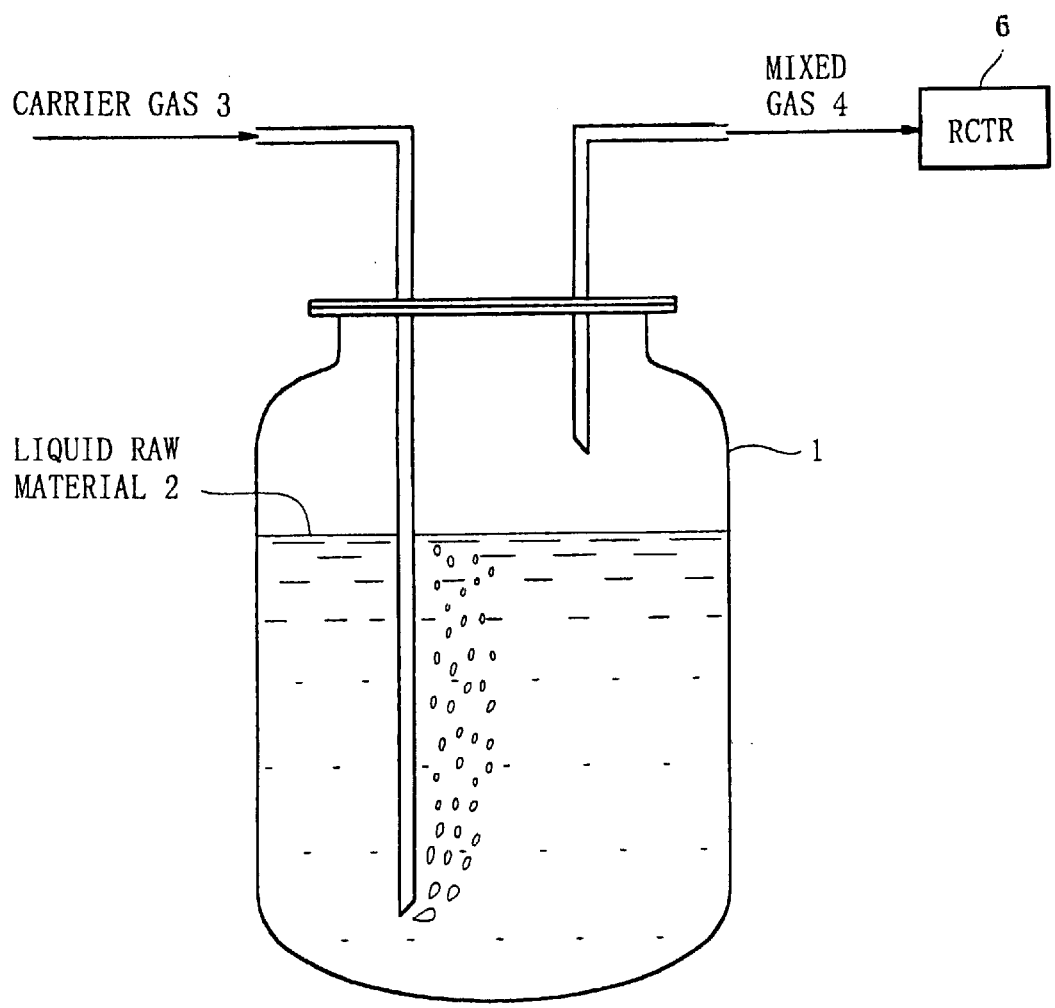
FIG. 4 shows a prior apparatus for feeding a gas for epitaxial gas.

As illustrated in FIG. 3 more specifically, in this embodiment the vaporizer 19 is a multi-tube type vaporizer. As a liquid raw material 20, trichlorosilane ($SiHCl_3$) is used. As a medium for heating this liquid raw material, water having a constant temperature over the boiling point of the liquid is used. This temperature is decided in the light of the total pressure of the ingredient gas pressure necessary for feeding into reactors plus the pressure lost at the feeding system extending from the vaporizers to the reactors, because the pressure of the liquid raw material and the boiling point thereof have a correlative relationship.

The boiling point of trichlorosilane is 31.8° C. and the vapor pressure thereof is 760 mmHg at the atmosphere. In order to raise the above-mentioned total pressure to over 760 mmHg (over the atmosphere), it is necessary to raise the boiling point of trichlorosilane and forcibly heat it in the vaporizers. When the pressure of, for example, 4.2 kg/cm$^2$ (i.e., 3.2 kg/cm$^2$G, 0.412 MPa, 3090 mmHg) is needed as the total pressure, with reference to the known vapor pressure table of trichlorosilane water as the heating medium is heated to 80° C. and then trichlorosilane is heated by the water. Similarly, when the pressure of 6.8 kg/cm$^2$ (i.e., 5.8 kg/cm$^2$G, 0.667 MPa, 5000 mmHg) is needed as the total pressure, water is heated to 100° C. and then trichlorosilane is heated by the water. The pressure of the vaporized gas can be changed into a desire value by changing the temperature of water as the heating medium as described above.

A tube 17 is connected through a switching valve 21 and a tube 22 to the bottom of the vaporizer 19. A tube 23 connected to the other end of the switching valve 21 is connected to a non-illustrated collecting tank. Hot water 24 as the heating medium is introduced into the vaporizer 19 at its lower side portion and is discharged from the vaporizer 19 at its upper side. To the top of the vaporizer 19 a tube 25 for forwarding the vaporized ingredient gas is connected. A liquid surface level gauge 26 is provided at another side of the vaporizer 19. A pressure sensor 27 for measuring the pressure of the vaporized ingredient gas is equipped with the upper inside of the vaporizer 19. The output from the pressure sensor 27 is connected to a controller 28. The controlling output from the controller 28 is connected to the flow adjusting valve 18.

Turning to FIGS. 1 and 2, tubes 25 from the two vaporizers 19 are connected through a switching valve 31 and a tube 32 to a buffer tank 33. Mass flow controllers 36 are connected through a tube 34 to the tank 33. The vaporizers may be integrated with buffer tanks, which is not illustrated. In this case, a switching valve is disposed at the position where the two tubes connected to forwarding-openings of the two buffer tanks are jointed. The pressure sensor 27 may be set at the inside of the buffer tank, as shown in FIG. 3.

In this embodiment, hydrogen gas is used as a carrier gas. A gas such helium (He) gas, besides hydrogen gas, may be used. The carrier gas is stored in a tank 37. Mass flow controllers 41 are connected through a tube 38 and a heater 39 to the carrier gas tank 37. The number of the mass flow controllers 36 and 41 is decided according to the controlling amount of the mass flows. In this embodiment, five mass flow controllers may be set up, respectively. The mass flow controllers 36 and 41 are connected through a tube 42 to a mixer 43. A buffer tank 46 is connected through a tube 44 to the mixer 43. A flow adjusting valve 48 is connected through a tube 47 to the buffer tank 46.

Plural reactors 51 for epitaxial growth are connected through a tube 49 to the flow adjusting valve 48. In this embodiment, ten reactors are installed. The tube 49 is composed of a main tube 49a connected to the flow adjusting valve 48 and a loop tube 49b for connecting the main tube 49a to the reactors 51. A distributing valve 52 is located at the position where the main tube 49a and the loop tube 49b are jointed, so that the mixed gas which has passed through the main tube 49a will flow into the loop tube 49b along both directions shown by arrows in FIGS. 1 and 2. Heating and temperature-retaining means 53 for heating the ingredient gas and the mixed gas to over their condensing points and retaining the temperature is arranged from the ingredient gas forwarding tube 25 of the vaporizer 19 to the tube 49, as illustrated in FIG. 1 but not illustrated in FIG. 2. Specifically, the buffer tanks 33 and 46, the mass flow controller 36, the mixer 43 and the flow adjusting valve 48 are covered with jackets respectively, and heating and temperature-retaining pipes are in parallel provided to the tubes 25, 32, 34, 42, 44, 47 and 49 respectively, which are not illustrated in any figures. Hot water having a temperature over the condensing point of the above-mentioned gas can pass through the jackets and pipes.

In the above-mentioned feeding apparatus, a gas for epitaxial growth is fed to the reactors 51 according to the following steps.

As shown in FIG. 2, the liquid raw material (trichlorosilane) in the container 10, which has been transported, is transferred through the tube 11 to the storage tank 12 and stored therein. The liquid raw material in the tank 12 is distributed into the two feeding tanks 16 with the switching valve 14 and stored therein. The two feeding tanks 16 are used alternately.

As illustrated in FIG. 3, the flowing amount of the liquid raw material in the feeding tank 16 is adjusted to a predetermined flowing amount with the flow adjusting valve 18 and then is fed through the switching valve 21 into the vaporizer 19. The liquid surface level of the liquid raw material in the vaporizer 19 is monitored with the liquid surface level gauge 26 to prevent overflow of the liquid raw material. After a predetermined amount of the liquid raw material is stored, hot water whose temperature is controlled to be constantly 100° C., in this embodiment, is introduced as a heating medium into the vaporizer 19. The liquid raw material is heated by hot water instead of electricity or steam, so that the heating temperature can be kept more stable. The heating permits trichlorosilane, which is the liquid raw material, to be vaporized in the vaporizer 19, so as to measure the vapor pressure thereof with the pressure sensor 27. The controller 28 can control the flow adjusting valve 18 in accordance with the output from the pressure sensor 27 to adjust the feeding amount of the liquid raw material, i.e., trichlorosilane. Thus, the liquid surface level in the vaporizer 19 and the gas pressure therein are controlled to be kept constant. As described above, the gas pressure of trichlorosilane is controlled to be 6.8 kg/cm$^2$ (5.8 kg/cm$^2$G, 0.667 MPa, 5000 mmHg).

The ingredient gas (trichlorosilane gas) obtained by vaporization stores in the buffer tank 33 and is kept therein. This makes it possible to absorb fluctuations in pressure of the ingredient gas. The mass flow of the ingredient gas forwarded from the buffer tank 33 is controlled with the mass flow controllers 36 to be constant. The mass flow of the carrier gas (hydrogen gas) fed from the carrier gas tank 37 and heated with the heater 39 is also controlled with the mass flow controllers 41 to be constant. The heater 39 allows the carrier gas to be heated to the same temperature as that of the ingredient gas. The control by the mass flow controllers 36 and 41 is carried out dependently on the concentration of the ingredient gas necessary in the reactors. This makes it possible to mix the gases to have desired concentrations.

The mass flow-controlled ingredient gas (trichlorosilane) and carrier gas (hydrogen gas) are mixed in the mixer 43 and kept in the buffer tank 46, thereby absorbing fluctuations in pressure of the mixed gas. A pressure sensor, which is not illustrated in any figures, is set up at the inside of the buffer tank 46 to adjust the flowing amount of the mixed gas forwarded from the buffer tank 46 with the flow adjusting valve 48 on the basis of the output from the sensor. The mixed gas whose flow is adjusted to be constant is distributed into the loop tube 49b along its two directions with the distributing valve 52. The distribution along the two directions makes it possible to reduce loss in pressure of the mixed gas in the downstream side reactors of the plural ones. In other words, the mixed gas is stably fed into the plural reactors 51 at a respective predetermined concentration, so that silicon mono-crystal thin layers are epitaxially grown at predetermined speeds on the mono-crystal silicon substrates located in the reactors.

During the period when the vaporizer 19 is operated and the mixed gas is fed into the reactors 51, the buffer tanks 33 and 46, the mass flow controllers 36, the mixer 43, the flow adjusting valve 48, and the tubes 25, 32, 34, 42, 44, 47 and 49 are heated to over the condensing point of the ingredient gas or the mixed gas, and the temperature are retained. This results in preventing fluctuations in the concentration of the ingredient gas in the mixed gas.

After the vaporizing operation of the liquid raw material in the single vaporizer 19 is conducted for a certain time, the liquid raw material is vaporized in another vaporizer 19. When the pressure of the vaporized ingredient gas in another vaporizer reaches a predetermined value, the switching valve 31 is switched, thereby making it possible to prevent heavy metals and high boiling point impurities remained in the liquid raw material by vaporization for a long time from polluting the ingredient gas and to continuously keep the ingredient gas having a high purity in the buffer tank 33. A used liquid raw material is discharged by switching the switching valve 21 in FIG. 3 and forwarded to the non-illustrated collecting tank.

In the present embodiment, the ingredient gas and the carrier gas are mixed to be fed into the reactors. In the present invention, however, only the ingredient gas, which contains no career gas, may be fed into the reactors.

As described above, the present invention makes it possible to adjust the flow of the liquid raw material by vaporizing it so as to have a predetermined concentration at the vaporizer, not by the prior bubbling manner, and to set the concentration and the pressure of the gas for epitaxial growth into desired values easily. It is also possible to produce the ingredient gas dependently on the volume of the vaporizer, thereby feeding the gas for epitaxial growth with a constant concentration stably from the single gas feeding apparatus into the plural reactors.

Furthermore, it is possible to feed the gas for epitaxial growth having a high purity continuously, without the prior interruption resulting from exchanging the gas cylinder. If, in particular, the liquid raw material is vaporized at the vaporizer under the condition that the temperature of the heating medium is kept constant and the feeding amount of the liquid raw material into the vaporizer is adjusted by controlling the gas pressure in the vaporizer, the liquid surface level of the vaporizer can be controlled to be kept constant.

We claim:

1. An apparatus for feeding a gas for epitaxial growth, comprising:

a vaporizer for heating a liquid raw material to vaporize the liquid raw material by water having a temperature of the liquid raw material's boiling point or higher, a first mass flow controller for controlling a vaporized ingredient gas at the vaporizer to have a first predetermined mass flow, a second mass flow controller for controlling a carrier gas to have a second predetermined mass flow, a mixer for mixing the ingredient gas and the carrier gas controlled into the respective first and second predetermined mass flows, a first flow adjusting valve for adjusting the flowing amount of the mixed gas composed of the ingredient gas and the carrier gas, a tube for feeding the flow-adjusted mixed gas into a reactor for epitaxial growth, a means for heating the ingredient gas and the mixed gas to over the respective condensing points for the ingredient gas and the mixed gas and maintaining the ingredient gas and the mixed gas at a temperature above the respective condensing points between the ingredient gas feeding tube of the vaporizer and the flow-adjusted mixed gas feeding tube for the reactor, a pressure sensor for measuring a pressure of the ingredient gas inside the vaporizer, a second flow adjusting valve for adjusting the feeding amount of the liquid raw material into the vaporizer, and a controller for controlling the second flow adjusting valve on the basis of pressure measured by the pressure sensor.

2. A feeding apparatus according to claim 1, further comprising at least one additional vaporizer connected in parallel to the vaporizer, a means for forwarding the ingredient gas from a single vaporizer selected from the parallel-connected vaporizers into the first mass flow controller, and a storage tank for storing the liquid raw material, wherein each additional vaporizer has a separate flow adjusting valve connected to the storage tank for adjusting the feeding amount of the liquid raw material from the storage tank into each additional vaporizer.

3. A feeding apparatus according to claim 1, which has a first buffer tank for storing the ingredient gas vaporized at the vaporizer, and wherein the ingredient gas forwarded from the first buffer tank is controlled to have a predetermined mass flow with the first mass flow controller.

4. A feeding apparatus according to claim 1, which further has a second buffer tank for storing the mixed gas mixed in the mixer, and wherein the flowing amount of the mixed gas is adjusted with the first flow adjusting valve on the basis of the pressure of the mixed gas in the second buffer tank.

5. A feeding apparatus according to claim 1, further comprising at least one additional reactor for epitaxial growth, wherein the tube comprises a main tube connected to the first flow adjusting valve and a loop tube for connecting the main tube to the additional reactor for epitaxial growth, and the mixed gas passing through the main tube can flow into the loop tube along two directions.

\* \* \* \* \*